United States Patent [19]

Nakabayashi et al.

[11] Patent Number: 5,227,682
[45] Date of Patent: Jul. 13, 1993

[54] SEMICONDUCTOR INTEGRATED CIRCUIT OPERATING IN SYNCHRONISM WITH A REFERENCE SIGNAL

[75] Inventors: Takeo Nakabayashi; Kouji Gotou, both of Hyogo, Japan

[73] Assignee: Mitsubishi Denki Kabushiki Kaisha, Tokyo, Japan

[21] Appl. No.: 776,048

[22] Filed: Oct. 15, 1991

[30] Foreign Application Priority Data

Oct. 15, 1990 [JP] Japan .................................. 2-277003

[51] Int. Cl.$^5$ .............................................. H03K 5/13
[52] U.S. Cl. .................................... 307/596; 307/269; 307/603
[58] Field of Search ............... 307/596, 269, 480, 481, 307/603, 608; 377/76; 371/23.2

[56] References Cited

U.S. PATENT DOCUMENTS

| | | | |
|---|---|---|---|
| 3,422,425 | 1/1969 | Vallee . | |
| 4,745,302 | 5/1988 | Hanawa et al. | 307/269 |
| 5,059,838 | 10/1991 | Motegi et al. | 307/603 |
| 5,124,572 | 6/1992 | Mason et al. | 307/480 |

*Primary Examiner*—Jin F. Ng
*Assistant Examiner*—Sinh Tran
*Attorney, Agent, or Firm*—Lowe, Price, LeBlanc & Becker

[57] ABSTRACT

A semiconductor integrated circuit comprises a timing signal generating circuit for generating a plurality of timing signals in response to an externally applied reference signal, a plurality of sequential circuits to be operated in synchronism with the plurality of timing signals respectively, a plurality of combination circuits provided between the plurality of sequential circuits. Each timing signal to be applied to each sequential circuit is delayed by the time period longer than the difference between the delay amount in a combination circuit at the preceding stage and the period of a reference signal with respect to a timing signal to be applied to a sequential circuit at the preceding stage.

5 Claims, 6 Drawing Sheets

SEMICONDUCTOR INTEGRATED CIRCUIT OPERATING IN SYNCHRONISM WITH A REFERENCE SIGNAL

BACKGROUND OF THE INVENTION

1. Field of the Invention

The invention relates generally to semiconductor integrated circuits and, more particularly, to a semiconductor integrated circuit operating in synchronism with an externally applied reference signal.

2. Description of the Background Art

FIG. 5 is a block diagram illustrating one example of a conventional semiconductor integrated circuit operating in synchronism with an externally applied reference signal.

The semiconductor integrated circuit of FIG. 5 comprises a plurality of sequential circuits 11, 12, 13, 14 and a plurality of combination circuits 21, 22, 23, 24. The combination circuits 21-24 are arranged between sequential circuits, respectively. Input data Din is applied to sequential circuit 11, predetermined processing related to the data is performed in sequential circuits 11-14 and combination circuits 21-24, and the result of processing is output as output data Dout from combination circuit 24 Each of sequential circuits 11-14 operates in response to an externally applied reference signal CK.

A sequential circuit is a circuit of which output state at a given time is determined by a prior input state. A combination circuit is a circuit which output state at a given time is determined by an input state at that time. One of the simplest examples of sequential circuits and combination circuits is shown in FIG. 6. A transfer gate formed by transistor is an example of a sequential circuit. A circuit structured by logic gates is an example of a combination circuit.

In the semiconductor integrated circuit of FIG. 5, the upper limit of its operation speed, that is, the upper limit of the frequency of reference signal CK is determined by the largest delay amount among delay amounts (delay time period) which combination circuits 21-24 respectively have. Assume that, for example, combination circuit 21 has a delay amount D1 of 100 ms, and combination circuits 22, 23, 24 have delay amounts D2, D3, D4 of 90 ms, respectively. In this case, the frequency of reference signal CK is determined by delay amount D1 of combination circuit 21, and therefore it is 10Hz. Thus, no matter how small delay amounts D2, D3, D4 of the other combination circuits 22, 23, 24 are, the maximum operation speed of the semiconductor integrated circuit is determined by the delay amount of combination circuit 21.

A delay amount of a sequential circuit can be assumed to be almost 0.

FIG. 7 is a block diagram illustrating another example of a conventional semiconductor integrated circuit operating in synchronism with an externally applied reference signal.

The semiconductor integrated circuit of FIG. 7 further comprises a timing signal generating circuit 2 generating two kinds of timing signal CK10, CK20 in response to an externally applied reference signal CK. Sequential circuits 11, 14 operate in response to a rise of timing signal CK10 and sequential circuits 12, 13 operate in response to a rise of timing signal CK20. The time period from the time point of operation of sequential circuit 11 to the time point of operation of sequential circuit 12 is shown as T11 and the time period from the time point of operation of sequential circuit 12 to the time point of operation of sequential circuit 13 is shown as T12. The time period from the time point of operation of sequential circuit 13 to the time point of operation of sequential circuit 14 is shown as T13.

A timing chart of externally applied reference signal CK and timing signals CK10, CK20 is shown in FIG. 8.

A period of reference signal CK is CY. Timing signals CK10, CK20 have the same period CY as that of reference signal CK. Timing signal CK20 is delayed by delay time period $\alpha$ with respect to timing signal CK10. The following expression is obtained, because the time period T11 from the time point of operation of sequential circuit 11 to the time point of operation of sequential circuit 12 needs to be greater than delay amount D1 of combination circuit 21.

$$T11 = CY + \alpha \geq D1 \tag{1}$$

The following expression is obtained, because the time period T12 from the time point of operation of sequential circuit 12 to the time point of operation of sequential circuit 13 needs to be greater than delay amount D2 of combination circuit 22.

$$T12 = CY \geq D2 \tag{2}$$

The following expression is obtained, because the time period from the time of operation of sequential circuit 13 to the time point of operation of sequential circuit 14 needs to be greater than delay amount D3 of combination circuit 23.

$$T13 = CY - \alpha \geq D3 \tag{3}$$

Assuming that, for example, D1=100 ms, D2=D3=D4 =90 ms, $\alpha$=5 ms, the expression (1) can be as shown below.

$$T11 = CY + 5 \geq 100$$

The expression (3) can be as shown below.

$$T13 = CY - 5 \geq 90$$

Therefore, CY≧95.

As a result, it is possible to set the frequency of reference signal CK at 1000/95=10.5 Hz.

Thus, it is possible to increase the operation speed of a semiconductor integrated circuit.

In a case where a plurality of combination circuits have different delay amounts in the semiconductor integrated circuit of FIG. 7, an increase in an operation speed can be achieved by employing two kinds of timing signals CK10, CK20.

However, an operation speed cannot be increased in a case where delay amounts of all combination circuits 21-24 are large. Assume, for example, that delay amounts D1-D4 of combination circuits 21-24 are all 100 ms. In this case, in order to satisfy the expression (1) and (3), for example, delay time period $\alpha$ needs to be 0 and one period CY needs to be 100 ms. It is, therefore, necessary to set the frequency of reference signal CK at 10 Hz.

Thus, in the semiconductor integrated circuit of FIG. 7, when delay amounts of all combination circuits are large, an increase in an operation speed cannot be achieved.

SUMMARY OF THE INVENTION

An object of the invention is to increase the operation speed of a semiconductor integrated circuit regardless of a delay amount of each of combination circuits.

Another object of the invention is to make it possible to increase the frequency of a reference signal applied to a semiconductor integrated circuit.

A semiconductor integrated circuit of this invention comprises a reference signal generating circuit for generating a plurality of internal reference signals in response to an externally applied reference signal, a plurality of sequential circuit to be operated in response to the plurality of internal reference signals respectively, and a plurality of combination circuits provided between the plurality of sequential circuits respectively. The reference signal generating circuit delays an internal reference signal to be applied to each sequential circuit based on the delay amount in the combination circuit at the preceding stage to the sequential circuit.

According to the semiconductor integrated circuit, the operation speed of the whole semiconductor integrated circuit can be increased regardless of a delay amount of each combination circuit, because an internal reference signal to be applied to each sequential circuit is delayed based on the delay amount in the combination circuit at the preceding stage to the sequential circuit.

That is, it is possible to set the period of an externally applied reference signal smaller than a delay amount of each combination circuit regardless of the delay amount of each combination circuit. Therefore, a semiconductor integrated circuit capable of high speed operation can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A detailed description of the embodiments of the invention will be made with reference to the drawings.

Figure 1:
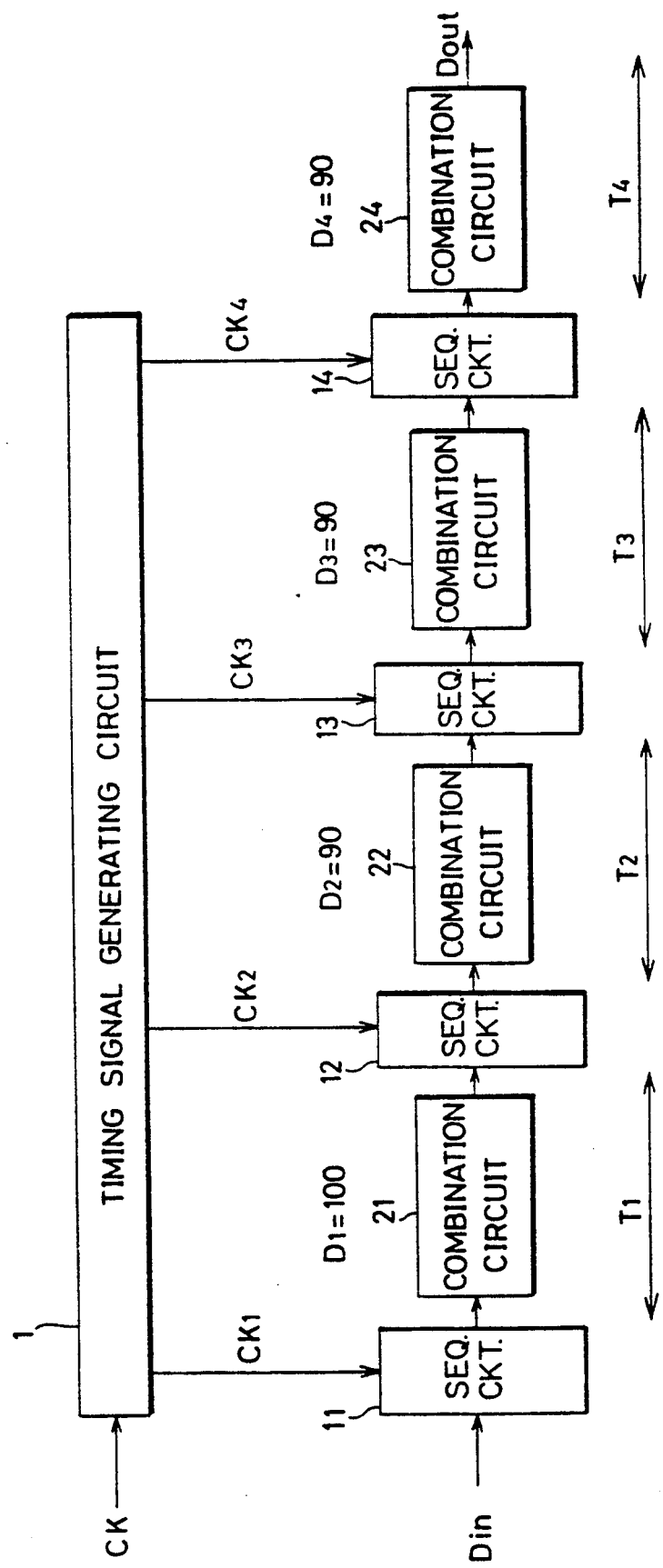
FIG. 1 is a block diagram illustrating a configuration of a semiconductor integrated circuit according to one embodiment of the invention.

FIG. 1 is a block diagram illustrating a semiconductor integrated circuit according to one embodiment of the invention. The semiconductor integrated circuit of FIG. 1 comprises a timing signal generating circuit 1 for generating a plurality of timing signals CK1, CK2, CK3, CK4 in response to an externally applied reference signal CK. Timing signals CK1, CK2, CK3, CK4 are applied to sequential circuits 11, 12, 13, 14, respectively. A combination circuit 21 is arranged between sequential circuits 11 and 12, a combination circuit 22 is arranged between sequential circuits 12 and 13, and a combination circuit 23 is arranged between 13 and 14. A combination circuit 24 is arranged at the output side of sequential circuit 14.

Referring to FIG. 1, the time period from the time point of operation of sequential circuit 11 to the time point of operation of sequential circuit 12 is indicated as T1 and the time period from the time point of operation of sequential circuit 12 to the time point of operation of sequential circuit 13 is indicated as T2. The time period from the time point of operation of sequential circuit 13 to the time point of operation of sequential circuit 14 is indicated as T3. The time period from the time point of operation of sequential circuit 14 to the time point of output of combination circuit 24 is indicated as T4.

Figure 2:
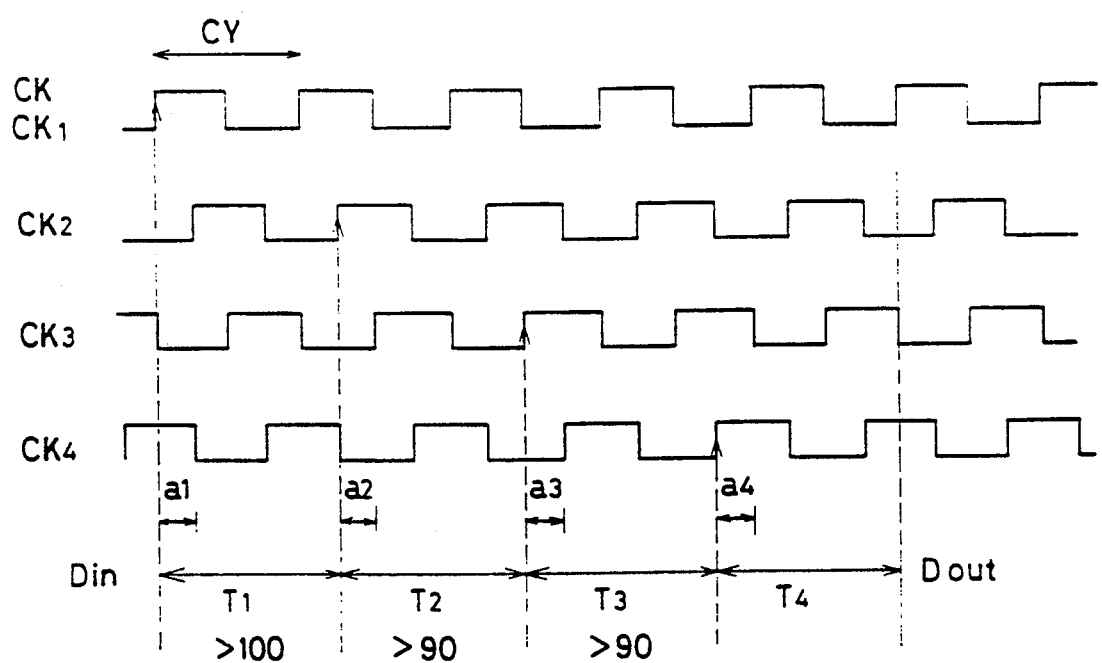
FIG. 2 is a timing chart for describing the operation of the semiconductor integrated circuit of FIG. 1.

FIG. 2 shows a timing chart of an externally applied reference signal CK and timing signals CK1, CK2, CK3, CK4.

One period of reference signal CK is CY. Timing signals CK1, CK2, CK3, CK4 have the same period CY as that of reference signal CK. Timing signal CK2 is delayed by delay time period a1 with respect to timing signal CK1 and timing signal CK3 is delayed by delay time period a2 with respect to timing signal CK2. Timing signal CK4 is also delayed by delay time period a3 with respect to timing signal CK3. Additionally, timing signal CK4 is delayed by time period (CY−a4) with respect to reference signal CK and timing signal CK1.

The following expression is obtained, because the time period T1 from the time point of operation of sequential circuit 11 to the time point of operation of sequential circuit 12 needs to be greater than a delay amount of D1 of combination circuit 21.

$$T1 = CY + a1 \geq D1 \tag{4}$$

The following expression is obtained, because the time period T2 from the time point of operation of sequential circuit 12 to the time point of operation of sequential circuit 13 needs to be greater than a delay amount D2 of combination circuit 22.

$$T2 = CY + a2 \geq D2 \tag{5}$$

The following expression is obtained, because the time period T3 from the time point of operation of sequential circuit 13 to the time point of operation of sequential circuit 14 needs to be greater than a delay amount D3 of combination circuit 23.

$$T3 = CY + a3 \geq D3 \tag{6}$$

The following expression can be obtained, because the time period T4 from the time point of operation of sequential circuit 14 to the time point of output of combination circuit 24 needs to be greater than a delay amount D4 of combination circuit 24.

$$T4 = CY + a4 \geq D4 \tag{7}$$

It is desirable that the following expression should be obtained in a case where another circuit (not shown) connected to the output side of combination circuit 24 operates in synchronism with reference signal CK.

$$a1+a2+a3+a4=CY \qquad (8)$$

Assume that, for example, D1=100 ms, D2=D3=D4=90 ms. In this case, the expressions (4)-(7) can be as shown below.

$$T1=CY+a1 \geq 100 \qquad (9)$$

$$T2=CY+a2 \geq 90 \qquad (10)$$

$$T3=CY+a3 \geq 90 \qquad (11)$$

$$T4=CY+a4 \geq 90 \qquad (12)$$

Assume that, for example, a1=25 ms, a2=a3=15 ms, a4=20 ms. In this case, if CY=75 ms, the above expressions (9)-(12) are satisfied. In this case, the frequency of reference signal CK is 1000/75=13.3 Hz.

If, for example, D1=D2=D3=D4=100 ms, the expressions (4)-(7) can be as shown below.

$$T1=CY+a1 \geq 100 \qquad (13)$$

$$T2=CY+a2 \geq 100 \qquad (14)$$

$$T3=CY+a3 \geq 100 \qquad (15)$$

$$T4=CY+a4 \geq 100 \qquad (16)$$

Assume that, for example a1=a2=a3=a4=20 ms. In this case, if CY=80 ms, the above expressions (13)-(16) are obtained. As a result, the frequency of reference signal CK is 1000/80=12.5 Hz.

In the above semiconductor integrated circuit, it is possible to make the period of reference signal CK smaller than a delay amount of each combination circuit regardless of the delay amount of each combination circuit. That is, viewed from the outside, the semiconductor integrated circuit can be deemed to be operated with the period of reference signal CK by applying timing signals CK1, CK2, CK3, CK4 as shown in FIG. 2 even when a delay amount of each combination circuit is greater than the period of reference signal CK. As a result, the delay amounts of combination circuit 21, 22, 23, 24 do not determine the operation speed of the semiconductor integrated circuit.

Figure 3:
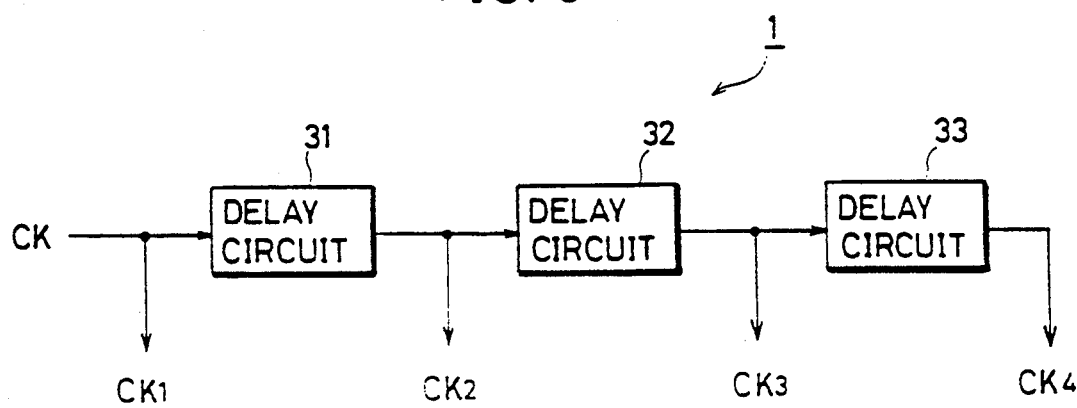
FIG. 3 is a diagram illustrating one example of a configuration of a timing signal generating circuit.

FIG. 3 is a diagram showing one example of a configuration of timing signal generating circuit 1. Timing signal generating circuit 1 comprises delay circuits 31, 32, 33. Externally applied reference signal CK is supplied to delay circuit 31. Reference signal CK is applied to sequential circuit 11 (FIG. 1) as timing signal CK1. Output of delay circuit 31 is applied to sequential circuit 12 (FIG. 1) as timing signal CK2. Output of delay circuit 32 is applied to sequential circuit 13 (FIG. 1) as timing signal CK3. Output of delay circuit 33 is applied to sequential circuit 14 (FIG. 1) as timing signal CK4.

Figure 4:
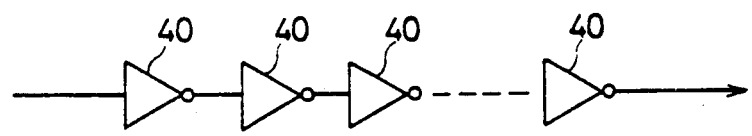
FIG. 4 is a circuit diagram illustrating one example of a configuration of a delay circuit.
Figure 5:
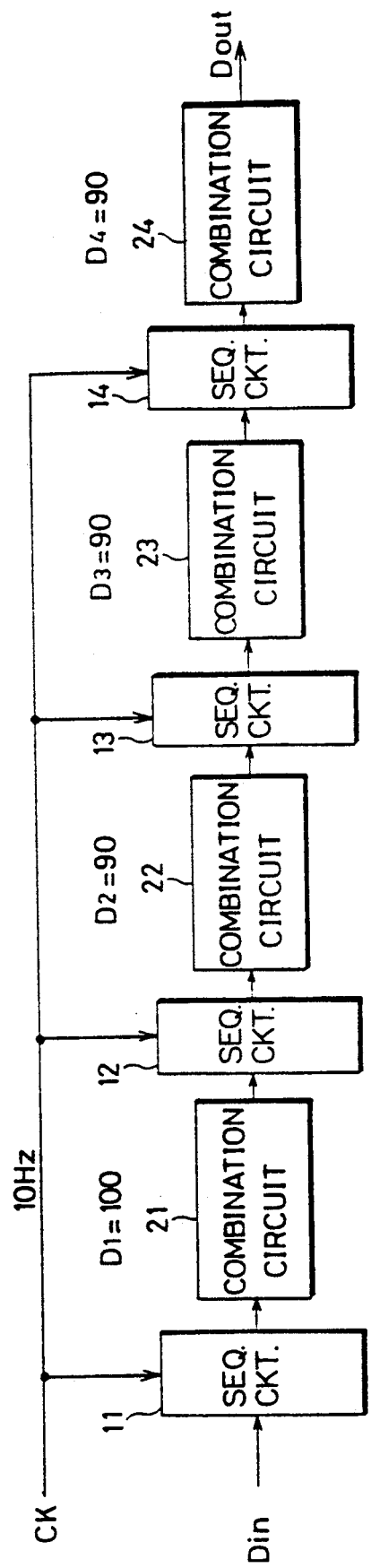
FIG. 5 is a block diagram illustrating one example of a configuration of a conventional semiconductor integrated circuit.
Figure 6:
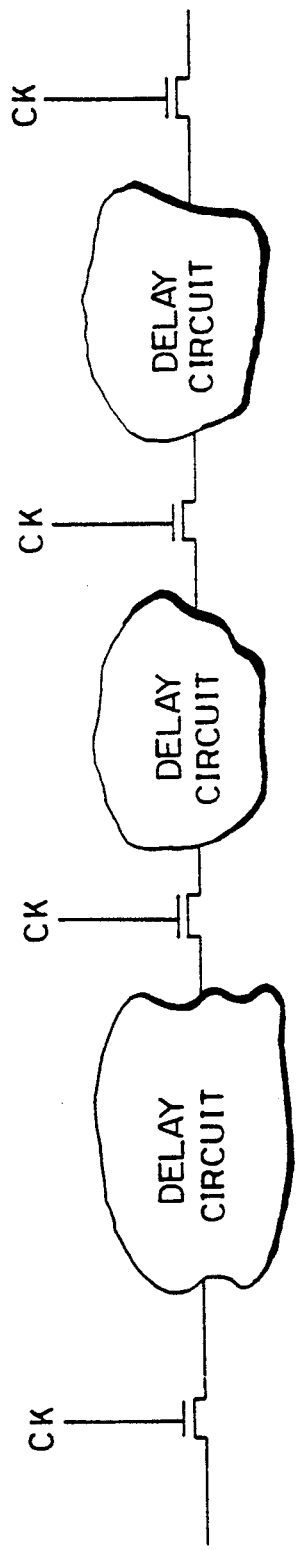
FIG. 6 is a diagram illustrating an example of sequential circuits and combination circuits.
Figure 7:
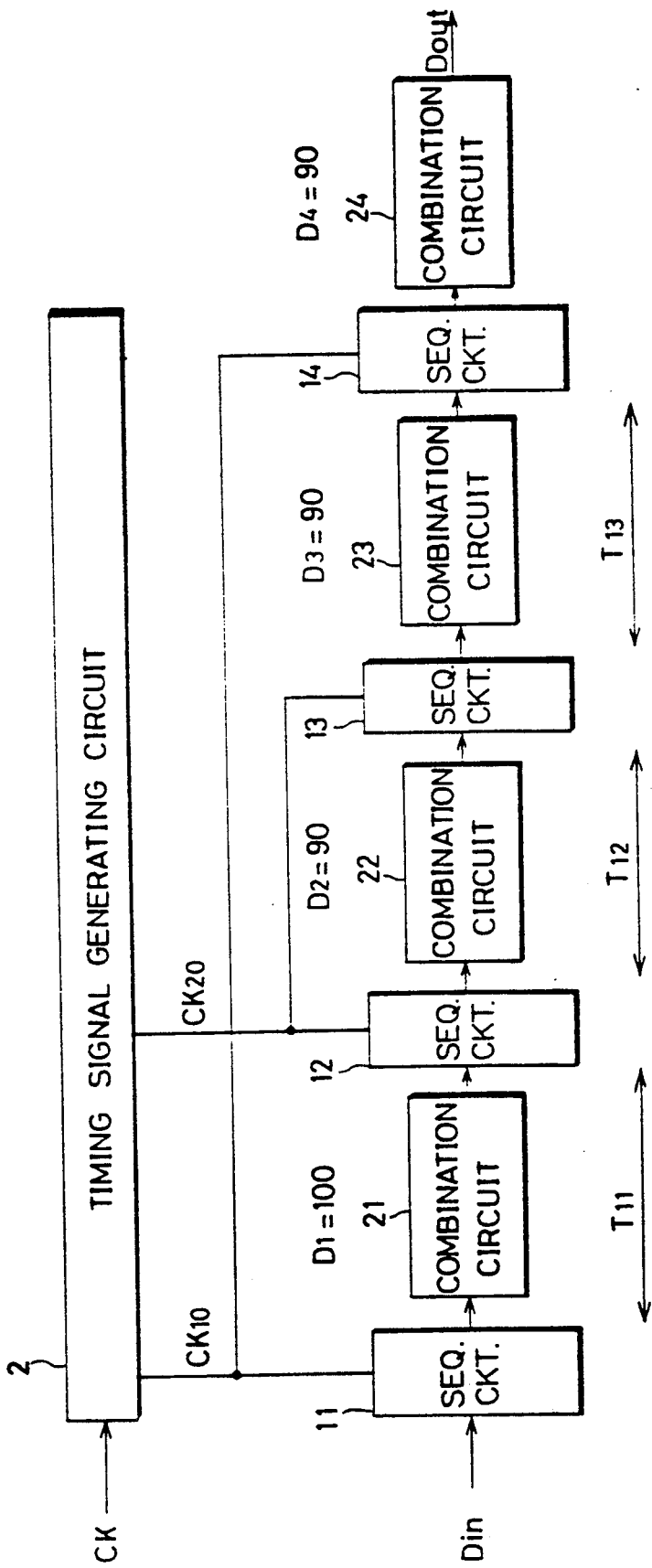
FIG. 7 is a block diagram showing another example of a conventional semiconductor integrated circuit.
Figure 8:
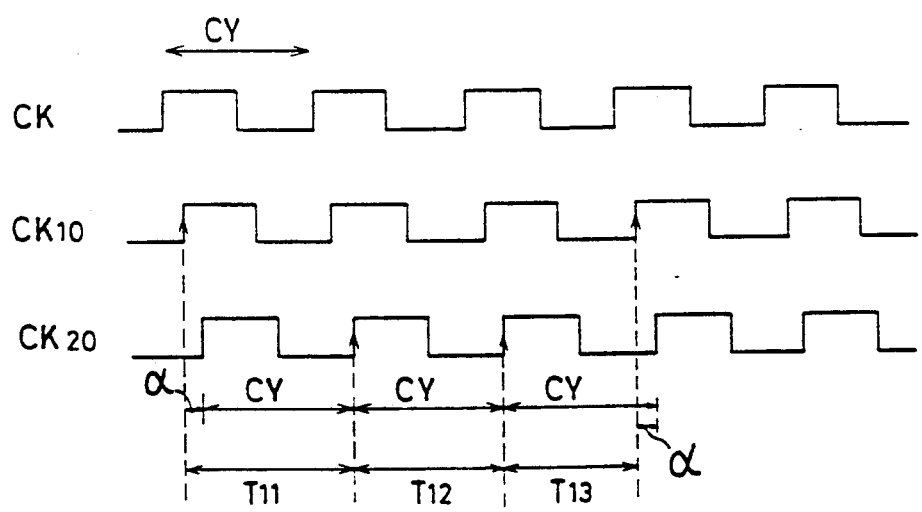
FIG. 8 is a timing chart for describing the operation of the semiconductor integrated circuit of FIG. 7.

FIG. 4 is a diagram showing one example of a configuration of a delay circuit. The delay circuit comprises a plurality of inverters 40. Delay time period can be adjusted by the number of inverters 40.

In the above embodiment, the time period from the time when input data Din is input to the time when output data Dout is output amounts to five periods of reference signal CK. Therefore, the time period from the time when input data Din is input to the time when output data Dout is output is increased by one period of reference signal CK compared to a conventional semiconductor integrated circuit.

In the semiconductor integrated circuit of the above embodiment, however, throughput of data can be increased, because the frequency of reference signal CK can be set high. Therefore, the semiconductor integrated circuit of the above embodiment is particularly efficient when it is employed in a system in which an increase in throughput is desired regardless of delay time period from input to output. It is possible, for example, to apply the semiconductor integrated circuit of the above embodiment to pipeline processing.

In the above embodiment, a combination circuit also comprises mere interconnections.

The time point of output from combination circuit 24 corresponds to a rise of reference signal CK in the above embodiment. Thus, another circuit connected to the output of combination circuit 24 can be operated in synchronism with reference signal CK.

If it is not necessary, however, the time point of output from combination circuit 24 does not necessarily have to correspond to a rise of reference signal CK.

The numbers of sequential circuits and combinations circuits are four respectively in the above embodiment. However, the numbers of sequential circuit and combination circuit are not limited to four.

Additionally, the delay time period from the time when input data Din is input to the time when output data Dout is output is increased by one period of reference signal CK, but the increment is not limited to one period.

A delay amount of each combination circuit is a mere example and it is not limited to the above mentioned value.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit operating in synchronism with an externally applied reference signal, comprising:

reference signal generating means responsive to an externally applied reference signal for generating a plurality of internal reference signals;

a plurality of sequential circuit means responsive to said plurality of internal reference signals to be operated, respectively; and a respective combination circuit means provided between each sequential pairs of said plurality of sequential circuit means, respectively, and an output combination circuit means connected to the last sequential circuit means, said reference signal generating means delaying each internal reference signal based on a delay amount in the combination circuit means at a preceding stage to a corresponding sequential circuit means;

the delay time periods of said plurality of internal reference signals being set so that the phase of an output signal of said output combination circuit means coincides with the phase of said externally applied reference signal.

2. The semiconductor integrated circuit according to claim 1, wherein said reference signal generating means delays each internal reference signal to be applied to each sequential circuit means by a time period longer than the difference between the delay amount in the respective combination circuit means at the preceding stage and the period of said externally applied reference signal with respect to the internal reference signal to be applied to the sequential circuit means at the preceding stage.

3. The semiconductor integrated circuit according to claim 1, wherein:
   said reference signal generating means generates said plurality of internal reference signals by delaying said externally applied reference signal sequentially; and
   each internal reference signal to be applied to each sequential circuit means is delayed by the time period longer than the difference between the delay amount in the respective combination circuit means at the preceding stage and the period of said externally applied reference signal with respect to the internal reference signal to be applied to the sequential circuit means at the preceding stage.

4. The semiconductor integrated circuit according to claim 3, wherein:
   said reference signal generating means comprises a plurality of delay means connected in series,
   the delay means at a first stage receives said externally applied reference signal,
   said plurality of delay means generate said plurality of internal reference signals, respectively,
   each of said plurality of delay means has a delay amount longer than the difference between the delay amount in the respective combination circuit means at the preceding stage to a corresponding sequential circuit means and the period of said externally applied reference signal.

5. An operation method of a semiconductor integrated circuit comprising a plurality of sequential circuit means responsive to an internal reference signal to be operated, a respective combination circuit means provided between each sequential pairs of said plurality of sequential circuit means, respectively, and an output combination circuit means connected to the last sequential circuit means, comprising the steps of:
   generating a plurality of internal reference signals by delaying an externally applied reference signal sequentially, the delay time period of said plurality of internal reference signals being set so that the phase of an output signal of said output combination circuit means coincides with the phase of said externally applied reference signal; and
   applying said plurality of internal reference signals to said plurality of sequential circuit means, respectively,
   each internal reference signal to be applied to each sequential circuit means being delayed by the time period longer than the difference between the delay amount in the combination circuit means at a preceding stage and the period of said externally applied reference signal with respect to the internal reference signal to be applied to the sequential circuit means at the preceding stage.

* * * * *